(12) United States Patent
Chen et al.

(10) Patent No.: US 8,835,300 B2
(45) Date of Patent: Sep. 16, 2014

(54) METHOD FOR INHIBITING GROWTH OF INTERMETALLIC COMPOUNDS

(75) Inventors: Chih Chen, Hsinchu (TW); King-Ning Tu, Hsinchu (TW); Hsiang-Yao Hsiao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 168 days.

(21) Appl. No.: 13/417,031

(22) Filed: Mar. 9, 2012

(65) Prior Publication Data

US 2013/0037940 A1 Feb. 14, 2013

(30) Foreign Application Priority Data

Aug. 9, 2011 (TW) .............................. 100128377 A

(51) Int. Cl.
*H01L 23/498* (2006.01)
*H01L 21/60* (2006.01)
*C23C 28/02* (2006.01)
*H01L 23/00* (2006.01)

(52) U.S. Cl.
CPC ..... *C23C 28/021* (2013.01); *H01L 2224/03849* (2013.01); *H01L 24/13* (2013.01); *H01L 24/11* (2013.01); *H01L 2924/3651* (2013.01); *H01L 2924/01322* (2013.01); *H01L 2224/11849* (2013.01); *H01L 2224/131* (2013.01); *H01L 2224/05611* (2013.01); *H01L 2224/05147* (2013.01); *H01L 2224/08503* (2013.01); *H01L 2924/10253* (2013.01); *H01L 2924/01327* (2013.01); *H01L 24/05* (2013.01); *H01L 2224/0401* (2013.01); *H01L 2924/01029* (2013.01); *H01L 24/03* (2013.01)
USPC .... 438/612; 257/737; 257/738; 257/E21.511; 257/E23.021; 257/E23.068; 257/E23.069; 438/108

(58) Field of Classification Search
USPC ................. 257/737, 738, E21.511, E23.021, 257/E23.068, E23.069; 438/108, 612
See application file for complete search history.

(56) References Cited

U.S. PATENT DOCUMENTS

| | | |
|---|---|---|
| 6,602,777 B1 | 8/2003 | Kao et al. |
| 6,716,737 B2 | 4/2004 | Plas et al. |

(Continued)

FOREIGN PATENT DOCUMENTS

| | | |
|---|---|---|
| TW | I302722 B | 11/2008 |
| TW | I338344 | 3/2011 |

OTHER PUBLICATIONS

S.J. Wang and C.Y. Liu; "Retarding Growth of Ni3P crystalline layer in Ni(P) substrate by reacting with Cu-bearing Sn(Cu) Solders"; *Scripta Materialia*; 2003; p. 813-818, vol. 49.

*Primary Examiner* — Peniel M Gumedzoe
(74) *Attorney, Agent, or Firm* — Muncy, Geissler, Olds & Lowe, P.C.

(57) ABSTRACT

The present invention relates to a method for inhibiting growth of intermetallic compounds, comprising the steps of: (i) preparing a substrate element including a substrate on which at least one layer of metal pad is deposited, wherein at least one thin layer of solder is deposited onto the layer of metal pad, and then carry out reflowing process; and (ii) further depositing a bump of solder with an appropriate thickness on the substrate element, characterized in that a thin intermetallic compound is formed by the reaction of the thin solder layer and the metal in the metal pad after appropriate heat treatment of the thin solder layer. In the present invention, the formation of a thin intermetallic compound is able to slow the growth of the intermetallic compound and to prevent the transformation of the intermetallic compounds.

5 Claims, 9 Drawing Sheets

(56) References Cited

U.S. PATENT DOCUMENTS

| | | | |
|---|---|---|---|
| 2003/0151141 A1* | 8/2003 | Matsuki et al. | 257/746 |
| 2003/0222352 A1* | 12/2003 | Kung et al. | 257/772 |
| 2006/0249844 A1* | 11/2006 | Yang | 257/737 |
| 2007/0141750 A1* | 6/2007 | Iwasaki et al. | 438/108 |
| 2008/0308297 A1* | 12/2008 | Jurenka et al. | 174/126.2 |
| 2011/0031002 A1 | 2/2011 | Sakai et al. | |

* cited by examiner

US 8,835,300 B2

METHOD FOR INHIBITING GROWTH OF INTERMETALLIC COMPOUNDS

BACKGROUND OF THE INVENTION

1. Field of the Invention

The present invention relates to a method for inhibiting growth of intermetallic compounds. Particularly, a method for inhibiting growth of intermetallic compounds formed by reacting a thin solder layer with a layer of metal pad is shown. Furthermore, the present invention relates to a structure of flip-chip bonding.

2. Description of Related Art

The development tendency in semiconductor and package technology is to increase the density of components on a chip, and the interconnections get smaller and smaller. At present, the size (diameter) of a solder bump in flip-chip bonding processes is about 100 μm. Referring to FIG. 1, FIG. 2A, and FIG. 2B, a prior solder bump in flip-chip is shown. A method of preparing the prior solder bump comprises: depositing a layer of Cu pad (12) with the thickness of 5 μm onto a silicon (Si) substrate (11); depositing a layer of Ni pad (13) with the thickness of 3 μm onto the layer of Cu pad (12); and depositing a solder (14) with the thickness of 70-100 μm onto the layer of Ni pad (13), so that a semiconductor chip element (1) comprising microbumps is formed. Furthermore, the semiconductor chip element (1) is performed via a flip chip process, namely the semiconductor chip element (1) is interconnected with the element (2), which is the silicon substrate (21) having the layer of Cu pad (22) and the layer of Ni pad (23). In the small bumps, such as the microbumps in 3D IC (referring to FIG. 2B), the total bump height of the microbump is about 20 μm, wherein the thickness of the solder is up to 10 μm, and the layer of Cu pad or the layer of Ni pad on the upper and under side (under-bump-metallization, UBM) is about 8 μm respectively. Due to the bonding process, at least 3 times reflowing processes, or using for a while, the solder bumps will eventually totally transform to bumps having intermetallic compounds, such as Cu—Sn, Ni—Sn or Cu—Ni—Sn. It has been discovered that the said intermetallic compounds are fragile so as to seriously affect the mechanical properties of the solder bumps. For example, when the element is used in portable products, the bumps may break if the products fall or are hit. In recent years, in order to improve the problem noted above, a Ni layer is deposited on the microbumps as a diffusion barrier layer. However, the cost of this method is high, and a negative effect on the mechanical properties of the bumps is realized due to the high stress of Ni.

A tin solder is commonly used as a solder in package technology. An eutectic SnPb solder was bonded with Cu or Ni in a melted state (about 220° C.) in early package industries. However, the eutectic SnPb solder will react with Cu to form intermetallic compounds, such as $Cu_3$—Sn and/or $Cu_6$—$Sn_5$. Since material having lead is harmful to the environment and environmental protection responsibility is becoming important, this kind of material of eutectic SnPb is forbidden to use as a solder in a flip chip bump, and lead free solder is used instead.

Currently, lead free solder, such as tin-silver or tin-silver-copper, etc, with a melting point about 50° C. higher than the prior eutectic SnPb solder, is commonly used. Subsequently, lead free solder should be performed in a bonding process at 250-260° C. However, most of the lead free solders react with Cu and Ni relatively fast and form a thick intermetallic compound (e.g. Cu—Sn compound). The mechanical properties of the solder bumps are good and can absorb stress, but the formed Cu—Sn intermetallic compounds have unsatisfactory mechanical properties (e.g. fragility). Therefore, when an entire structure having a thick Cu—Sn intermetallic compound undergoes stress, a brittle fracture within the Cu—Sn intermetallic compound is easy to occur, and will cause the entire structure to break.

Cu reacts with Sn rapidly, the reaction and subsequent growth even happens at room temperature. The growth of the intermetallic compounds (e.g. $Cu_6Sn_5$) can not be inhibited or controlled in the prior art. Generally, in the solder bump with a big size (e.g. the solder bump in flip chip), the intermetallic compound formed on the solder bump will not seriously affect the mechanical properties. Conversely, in a solder bump with a very small size (e.g. microbumps in 3D IC process), where the volume of the solder on the microbump is only one hundredth of the volume of the solder bump in typical flip chip processes, due to the bonding process, at least 10 times reflowing processes, or using for a while, the microbumps will quickly transform to bumps having Cu—Sn intermetallic compounds, which are fragile and will seriously affect the mechanical properties of the microbumps.

At present, a method for resolving the problem is that a Ni layer is deposited on the microbumps as a diffusion barrier layer. However, the cost of this method is high, and the negative effect on the mechanical properties of the bumps is realized due to the high stress of Ni.

In other prior art, Cu and Ni are deposited by the method of co-sputtering. However, the cost of the method is high, and a higher thickness film can not be formed by using the method. In addition, the speed of the reaction of lead free solder with Cu and Ni is much faster than the speed of the reaction of solder having lead with Cu and Ni, so that lead free solder can not be used in the method.

U.S. Pat. No. 6,716,738 B2 (Date of patent: Apr. 6, 2004) discloses "Method of fabrication multilayered UBM for flip chip interconnections by electroplating." The patent relates to a method of electroplating a Cu—Ni alloy layer by adjusting current density. The Cu—Ni alloy layer is used for controlling the stress and the components of the metal layers, wherein Ni layer is used as a reaction barrier layer to inhibit the growth of compounds formed by the reaction of the solder with Cu and Ni. However, the process of electroplating the Cu layer and the Ni layer at the same time is complicated, and the components and the stress of the metal layers are hard to control. The yielding rate and stabilities of the metal layers is bad. Moreover, Cu also reacts with the solder.

U.S. Pat. No. 6,602,777 (Date of patent: Aug. 5, 2003) discloses "Method for controlling the formation of intermetallic compound in solder joints." The patent relates to the intermetallic compound (e.g. $(Cu_{1-x}Ni_x)_6Sn_5$ or $(Ni_{1-y}Cu_y)_3Sn_4$) formed by the reaction between a solder and a Ni layer being controlled by adjusting the concentration of Cu in the solder. However, the growth of the intermetallic compounds formed by the solder and Cu can not be controlled by this method.

Taiwan Patent No. 1338344 (Date of patent: Mar. 1, 2011) discloses "Semiconductor chip with solder bump suppressing growth of inter-metallic compound and method of fabricating the same." The patent relates to how materials of the penetration layer penetrate into the solder bump to change the solder bump into a multi-component solder bump, so that the growth of the intermetallic compound is suppressed. However, the suppression of the Cu—Sn intermetallic compound is limited.

The public reference ("Retarding growth of $Ni_3P$ crystalline layer in Ni(P) substrate by reacting with Cu-bearing Sn(Cu) solders", S. J. Wang, C. Y. Liu, Scripta Materialia 49 (2003) 813-818) relates to the reaction of the solder and Ni controlled by adjusting the concentration of Cu in the SN—Cu solder, so that the $Ni_3P$ formation is inhibited. However, the growth of the Cu—Sn or Ni—Sn compounds is not inhibited.

In order to improve upon the problems and disadvantages as stated above, the present invention provides a method for controlling the growth of the thickness of the intermetallic compound formed between the solder and Cu, namely the intermetallic compound (e.g. Sn—Cu compound) formed by the rapid reaction of the solder and Cu prior to a bonding process, and inhibiting the growth of the thickness of intermetallic compounds after the bonding process.

SUMMARY OF THE INVENTION

The object of the present invention is to provide a method for inhibiting growth of intermetallic compounds, comprising the steps of:

(i) preparing a substrate element, including:
(i-1) depositing at least one layer of metal pad on a substrate;
(i-2) depositing at least one thin layer of solder onto the layer of metal pad, and then performing a heat treatment to obtain the substrate element, wherein the heat treatment may be a reflowing process in liquid or a solid state aging process; and depositing a bump of solder with an appropriate thickness on the substrate element; and
(ii) performing a following bonding process with the substrate element and other elements.

The present invention is particularly used for inhibiting the growth of the intermetallic compounds formed by reacting a thin solder layer with a Cu pad in package technology. According to the said method of the present invention, a thin layer of solder is deposited onto the layer of metal pad on the substrate prior to a chip bonding process, and then the heat treatment is performed. Furthermore, the following flip chip bonding process is performed. Herein, the thin solder layer is reacted with the metal in the metal pad to form a thin intermetallic compound first, so as to change the features and forms of the intermetallic compounds. Since the thin intermetallic compound is formed by the reaction of the thin solder layer and the metal in the metal pad prior to the bonding process, the formation rate of intermetallic compounds of solder bumps after the bonding process is inhibited.

Referring to FIG. 3, a scheme of illustrating the method according to the present invention is shown. A layer of metal pad is deposited on a substrate (Step: S201), a thin layer of solder is deposited on the layer of metal pad (Step: S301), and then a high temperature heat treatment is performed to obtain a substrate element. Herein, a thin intermetallic compound is formed by the reaction of the thin solder layer and the metal in the metal pad after the high temperature heat treatment is performed (Step: S401). Then, a bump of solder with an appropriate thickness is deposited on the substrate element (Step: S501). Once the substrate element is prepared by the steps of S101, S201, S301, S401, and S501, a following bonding process can be further performed (Step: S601).

In the method of the present invention, the thin intermetallic compound formed by the reaction of the thin solder layer and the metal in the metal pad can reduce channels between the metal pad and the solder so as to avoid the metal atoms in the metal pad reacting with the solder, and is used for isolating the metal in the metal pad from the solder bumps, so that the growth of the intermetallic compounds of the solder bumps can be efficiently inhibited. When a semiconductor element (e.g. a semiconductor chip) is performed via a flip chip bonding process, the thin intermetallic compound is formed between the solder and the metal pad on the substrate first, which can avoid the permeation of the metal atoms in the metal pad into the solder bumps. Therefore, the formation of the intermetallic compounds of the solder bumps after a reflowing process or multi-reflowing processes is reduced. On the other hand, the reducing rate of the metal atoms in the metal pad is also decreased.

It is another object of the present invention to provide a structure of flip-chip bonding or an interface of a solder, comprising:

(A) a substrate element, including:
(A-1) a substrate;
(A-2) at least one layer of metal pad, which is deposited on the substrate;
(A-3) at least one thin layer of solder, which is deposited on the layer of metal pad; and
(A-4) a bump of solder with an appropriate thickness, which is deposited on the substrate element;

wherein the substrate element (A) can be bonded with other substrate elements in flip chip by a reflowing process to obtain the structure of flip-chip bonding, wherein the substrate element (A) comprises a thin intermetallic compound with continuous laminated or similar continuous laminated structure formed by the reaction of the thin solder and the metal in the metal pad prior to the flip chip bonding process.

In the structure of the present invention, the thin intermetallic compound is used for isolating the metal in the metal pad from the solder bumps (interconnects). Therefore, the growth of the intermetallic compounds of the solder bumps is efficiently inhibited.

In the present invention, the method of depositing the layer of metal pad or the solder is not limited therein, which can be any depositing technique in the prior art, such as copper is deposited by a solution of copper sulphate, and Sn—Ag solder is deposited by a solution of $Sn_2P_2O_7$ and AgI.

In the present invention, the substrate is not limited therein, which can be a semiconductor chip, a silicon chip, polymers, or glass according to an embodiment of the present invention.

In the present invention, the metal of the metal pad is not limited therein, which can be copper, nickel, gold, or alloys thereof, and preferably copper according to an embodiment of the present invention. The range of thickness of the metal pad according to the present invention may be from several $\mu m$ to 100 $\mu m$.

In the present invention, the solder is not limited therein, which can be lead free solder, and preferably lead free solder according to an embodiment of the present invention.

The said thin solder layer may be 4 $\mu m$ or less, and preferably 2 $\mu m$ according to an embodiment of the present invention. In the present invention, the thickness of the solder bump is 100 $\mu m$ or less, and preferably 20 $\mu m$ after a bonding process.

The method for inhibiting growth of intermetallic compounds according to the present invention is particularly used in the area of 3D IC industries (e.g. 3D IC package technology), central processing unit (CPU), mobile phones, image processing chip, dynamic random access memory (DRAM), etc.

Other objects, advantages, and novel features of the invention will become more apparent from the following detailed description when taken in conjunction with the accompanying drawings.

DETAILED DESCRIPTION OF THE PREFERRED EMBODIMENT

Herein below, the present invention will be described in detail with reference to the embodiments. The present invention may, however, be embodied in many different forms and should not be construed as being limited to the embodiments set forth herein. Rather, these embodiments are provided to fully convey the concept of the invention to those skilled in the art.

First, a 2-μm-SnAg/Cu pad specimen, which is a specimen having a thin solder layer, is prepared.

A first specimen having a thin solder layer (2-μm-SnAg specimen) and a second specimen having a solder layer (19-μm-SnAg specimen) are prepared.

Figure 1:
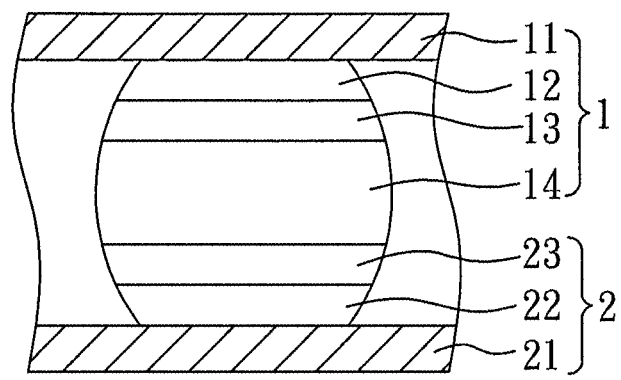
FIG. 1 is a schematic diagram of a prior solder bump in flip chip.
Figure 2A:
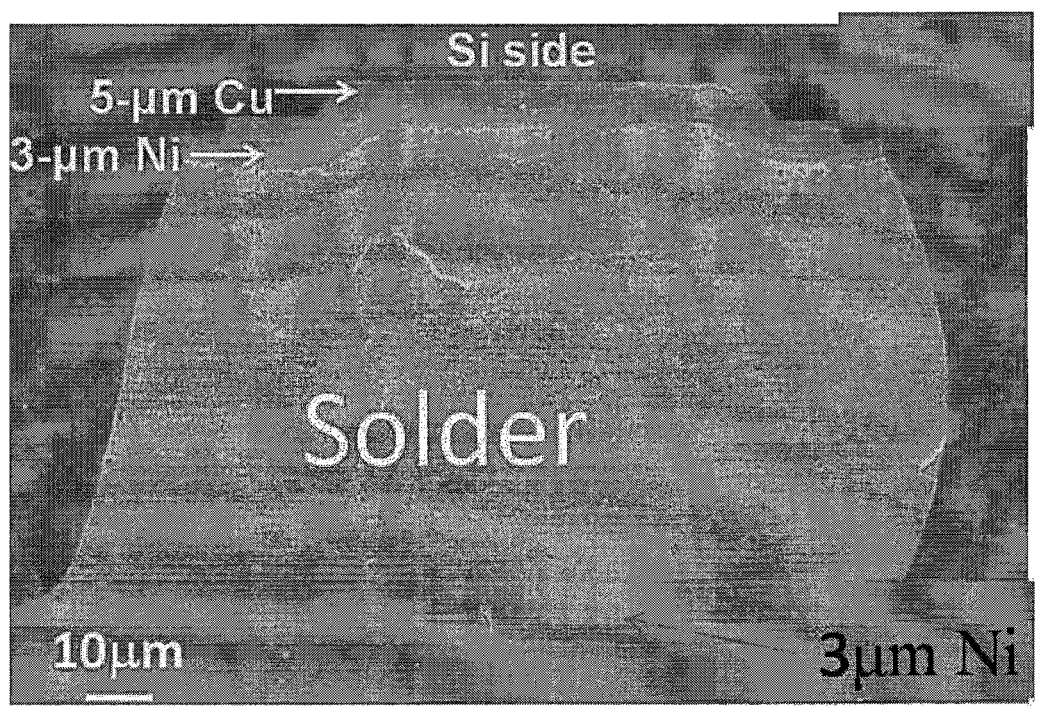
FIG. 2A is a SEM cross-sectional image of the prior solder bump in flip chip.
Figure 2B:
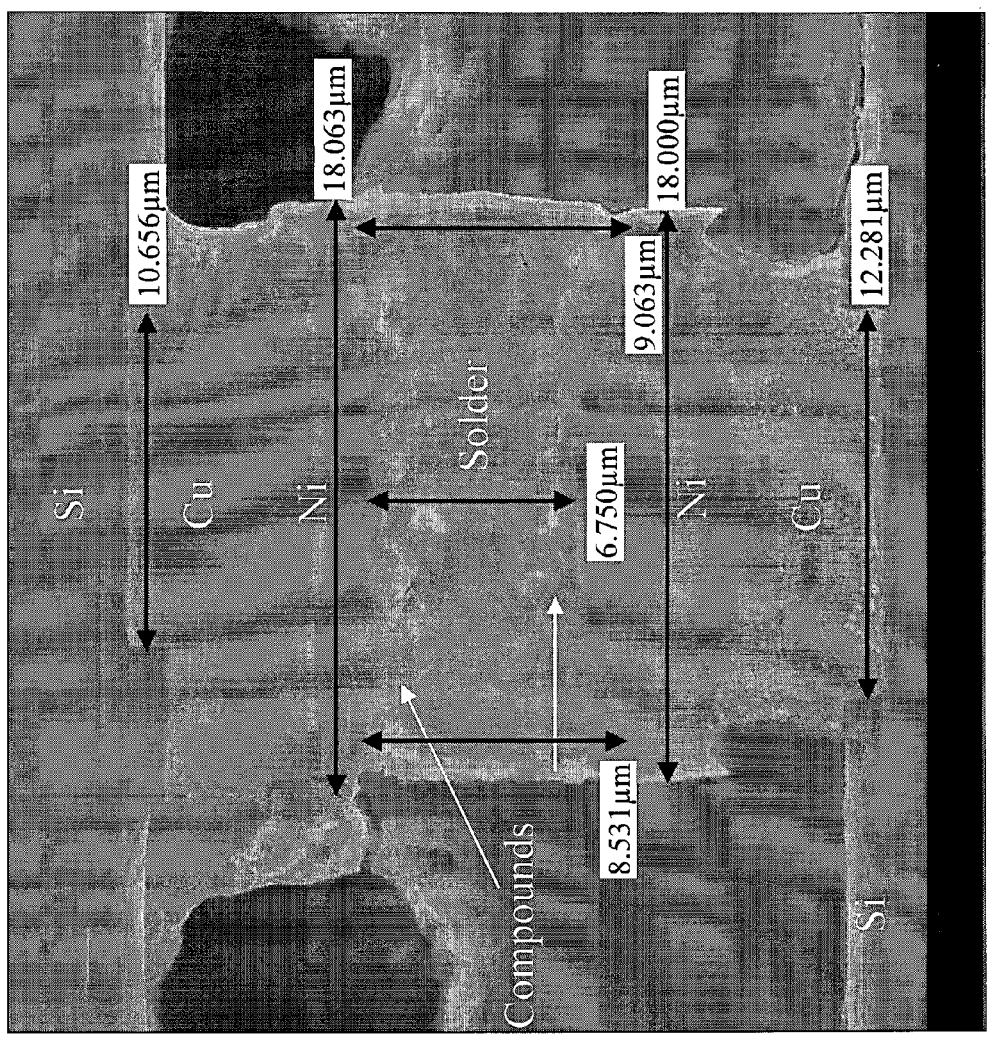
FIG. 2B is a SEM cross-sectional image of a prior microbump in flip chip with the thickness of 20 μm.
Figure 3:
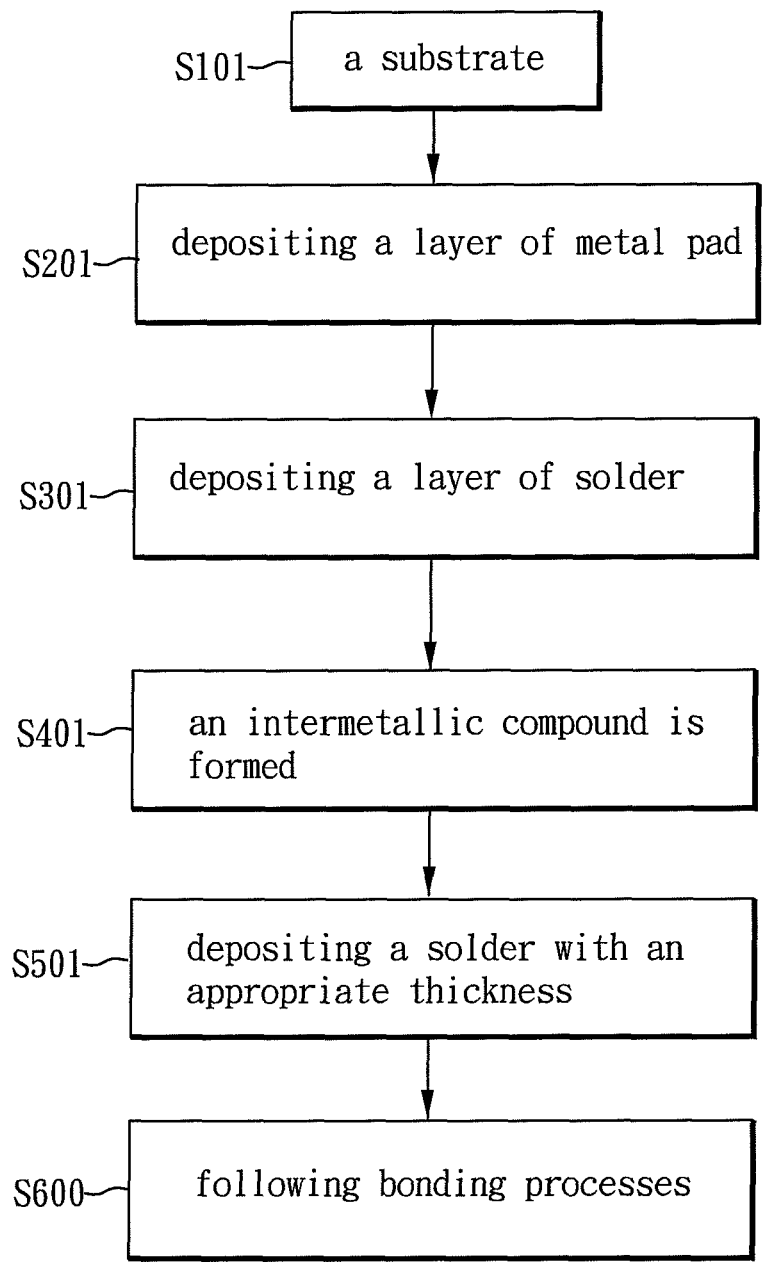
FIG. 3 is a scheme of illustrating a method according to the present invention.
Figure 4A:
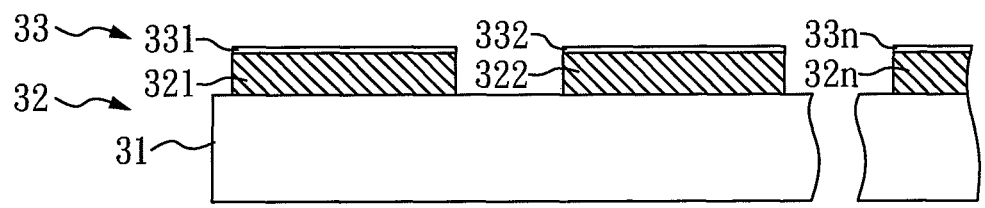
FIG. 4A is a schematic diagram of an embodiment of a substrate element having a thin solder layer according to the method of the present invention.

Referring to FIG. 4A, the first specimen having a thin solder layer, 2-μm-SnAg specimen, is prepared by the following steps:

First, a silicon chip is used as a first substrate (31), on which a first Cu pad with the thickness of 5 μm (Cu UBM) (321, 322, 32n; hereinafter referred to as "32") is deposited. A SnAg lead free solder layer with the thickness of 2 μm (331, 332, 33n; hereinafter referred to as "33") is deposited on the first Cu pad (32). Then, a reflowing process is performed at 260° C. for 10 μmin. A first thin Cu—Sn intermetallic compound (Cu—Sn IMC) is formed by the reaction of Cu and the lead free solder after the reflowing and cooling processes of the lead free solder, so that the 2-μm-SnAg specimen is obtained.

Figure 4B:
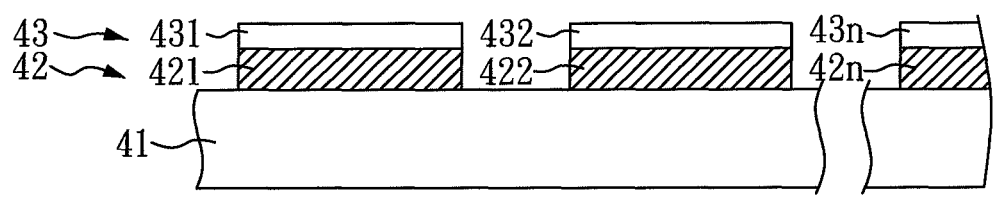
FIG. 4B is a schematic diagram of an embodiment of a substrate element having a solder layer according to the method of the present invention.

Referring to FIG. 4B, the second specimen having a solder layer, 19-μm-SnAg specimen, is prepared.

The other silicon chip is used as a second substrate (41), on which a second Cu pad with the thickness of 20 μm (Cu UBM) (421, 422, 42n; hereinafter referred to as "42") is deposited. A SnAg lead free solder layer with the thickness of 19 μm (431, 432, 43n; hereinafter referred to as "43") is deposited on the second Cu pad (42). Then, a reflowing process is performed at 260° C. for 1-10 μmin. A second Cu—Sn intermetallic compound (Cu—Sn IMC) is formed by the reaction of Cu and the lead free solder after the reflowing and cooling processes of the lead free solder, so that the 19-μm-SnAg specimen is obtained.

In the above processes, the thin Cu—Sn intermetallic compound is formed by the reaction of the Cu atoms in the first Cu pad and the thin solder layer (33) prior to a bonding process, wherein the thin Cu—Sn intermetallic compound can inhibit Cu atoms to react with the solder through the thin Cu—Sn intermetallic compound, so that the first Cu pad (32) is isolated from the solder bumps (interconnections).

In the embodiment of the present invention, SEM is used for detecting the cross-sectional images of the structures of the said specimens, which are performed reflowing processes at 260° C. for 5 μmin and 10 μmin to test the solder bumps.

Figure 5A:
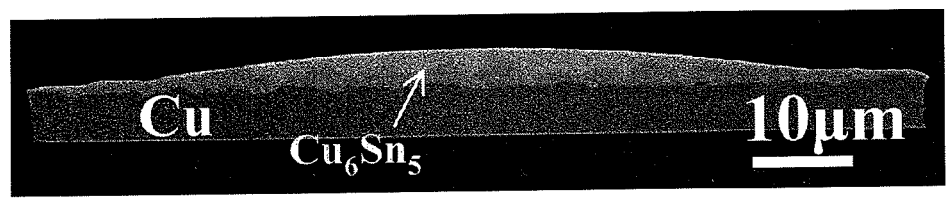
FIG. 5A is a SEM cross-sectional image of a Cu pad having the thickness of 5 μm on which a thin solder layer having the thickness of 2 μm is deposited according to the method of the present invention.
Figure 5B:
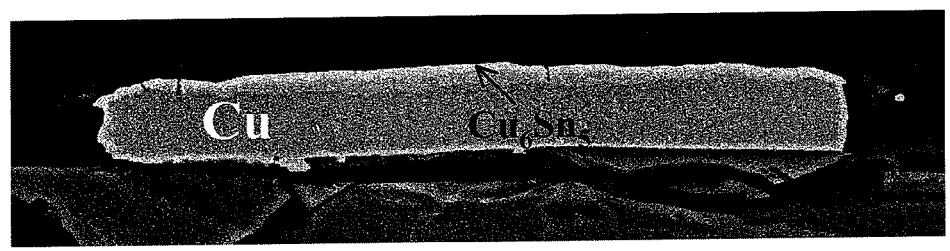
FIG. 5B is a SEM cross-sectional image of the Cu pad having the thickness of 5 μm on which the thin solder layer having the thickness of 2 μm is deposited according to the method of the present invention, wherein the Cu pad with the thin solder layer has been performed a reflowing process at 260° C. for 10 μmin.

Referring to FIGS. 5A, and 5B, the said 2-μm-SnAg specimen is shown. FIG. 5A shows a SEM cross-sectional image of the thus-prepared 2-μm-SnAg specimen. FIG. 5B shows a SEM cross-sectional image of the 2-μm-SnAg specimen after a reflowing process for 10 μmin. After the reflowing process for 10 μmin, the above lead free solder is completely reacted to the Cu—Sn intermetallic compound, which is observed obviously. The structure of the Cu—Sn intermetallic compound is a laminated structure. Therefore, the Cu—Sn intermetallic compound with laminated structure is used for inhibiting Cu atoms to permeate into the barrier layer of the solder during a following bonding process.

Figure 6A:
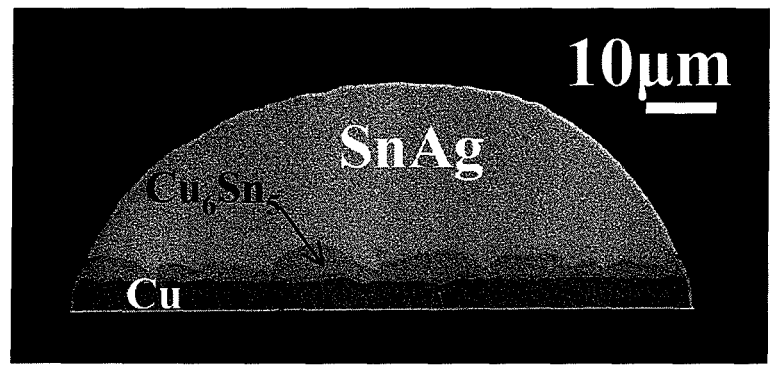
FIG. 6A is a SEM cross-sectional image of a 2-μm-SnAg specimen having a solder layer with an appropriate thickness according to the method of the present invention, wherein the solder bump having the thickness of 20 μm is further deposited on 2-μm-SnAg specimen after a pre-reflowing process for 10 μmin, and a second reflowing process is performed at 260° C. for 1 μmin.
Figure 6B:
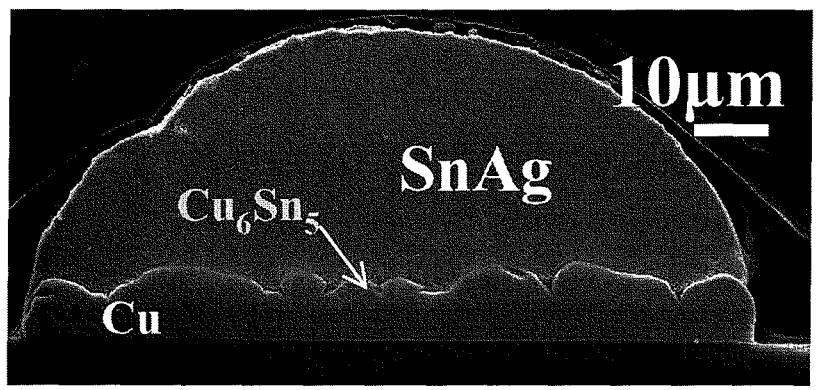
FIG. 6B is a SEM cross-sectional image of the 2-μm-SnAg specimen having the solder layer with an appropriate thickness according to the method of the present invention, wherein the solder bump having the thickness of 20 μm is further deposited on 2-μm-SnAg specimen after the pre-reflowing process for 10 μmin, and the second reflowing process is performed at 260° C. for 5 μmin.
Figure 6C:
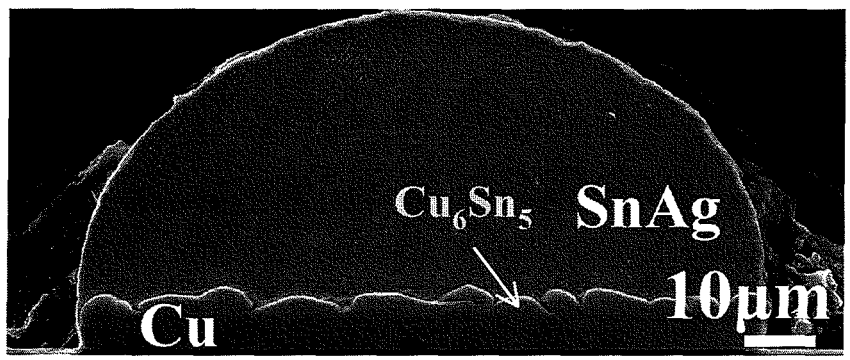
FIG. 6C is a SEM cross-sectional image of the 2-μm-SnAg specimen having the solder layer with an appropriate thickness according to the method of the present invention, wherein the solder bump having the thickness of 20 μm is further deposited on 2-μm-SnAg specimen after the pre-reflowing process for 10 μmin, and the second reflowing process is performed at 260° C. for 10 μmin.

Referring to FIGS. 6A, 6B, and 6C, a solder bump having the thickness of 20 μm is deposited on the 2-μm-SnAg specimen after a pre-reflowing process at 260° C. for 10 μmin, and then a second reflowing process is performed at 260° C. The SEM cross-sectional images of the 2-μm-SnAg specimen are shown respectively after the second reflowing process for 1 min (FIG. 6A), 5 μmin (FIG. 6B), and 10 μmin (FIG. 6C). As shown in FIG. 6C, the thin Cu—Sn intermetallic compound maintains the laminated structure after the second reflowing process for 10 μmin. Therefore, the thin Cu—Sn intermetallic compound can inhibit Cu atoms to permeate into the solder, so that Cu atoms are difficult to react with the solder.

Figure 7A:
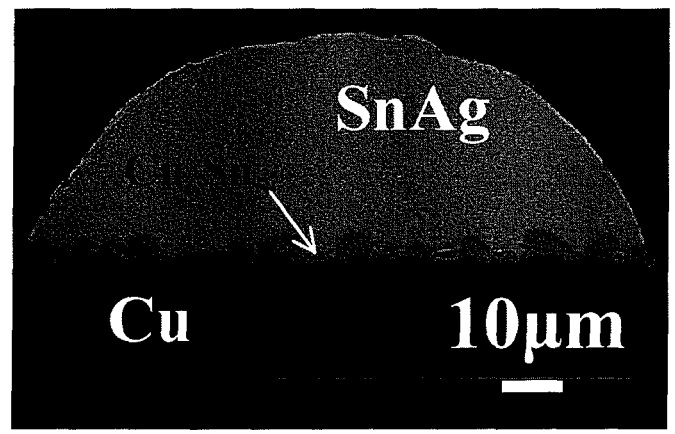
FIG. 7A is a SEM cross-sectional image of a 19-μm-SnAg specimen according to the method of the present invention, wherein the 19-μm-SnAg specimen has been performed a reflowing process at 260° C. for 1 μmin.
Figure 7B:
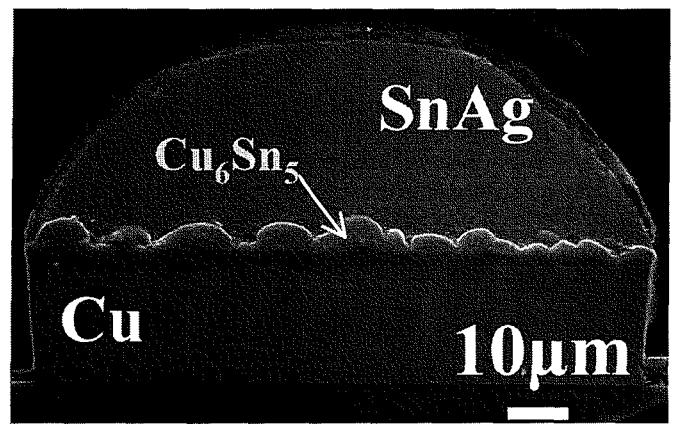
FIG. 7B is a SEM cross-sectional image of the 19-μm-SnAg specimen according to the method of the present invention, wherein the 19-μm-SnAg specimen has been performed a reflowing process at 260° C. for 5 μmin.
Figure 7C:
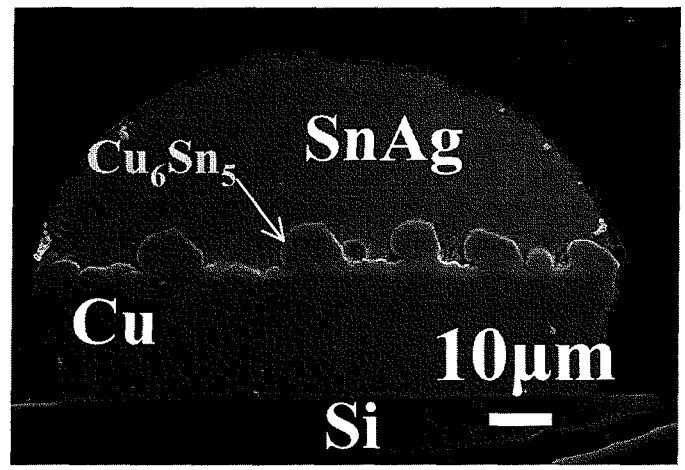
FIG. 7C is a SEM cross-sectional image of the 19-μm-SnAg specimen according to the method of the present invention, wherein the 19-μm-SnAg specimen has been performed a reflowing process at 260° C. for 10 μmin.

In the other aspect, the result of the test shows the Cu—Sn intermetallic compound grows relatively fast when the thin solder layer is not first deposited on the Cu pad. The SEM cross-sectional images of the 19-μm-SnAg specimen are shown respectively after a reflowing process for 1 μmin (FIG. 7A), 5 μmin (FIG. 7B), and 10 μmin (FIG. 7C). Referring to FIGS. 7A, 7B, and 7C, it is seen the thickness of the Cu—Sn intermetallic compound increases as the reflowing time increases. The shape of the Cu—Sn intermetallic compound is semicircular, so that Cu atoms are easy to permeate into the solder through the Cu—Sn intermetallic compound, and react with the solder. Therefore, the thickness of the Cu—Sn intermetallic compound increases significantly as the reflowing time increases.

Figure 8:
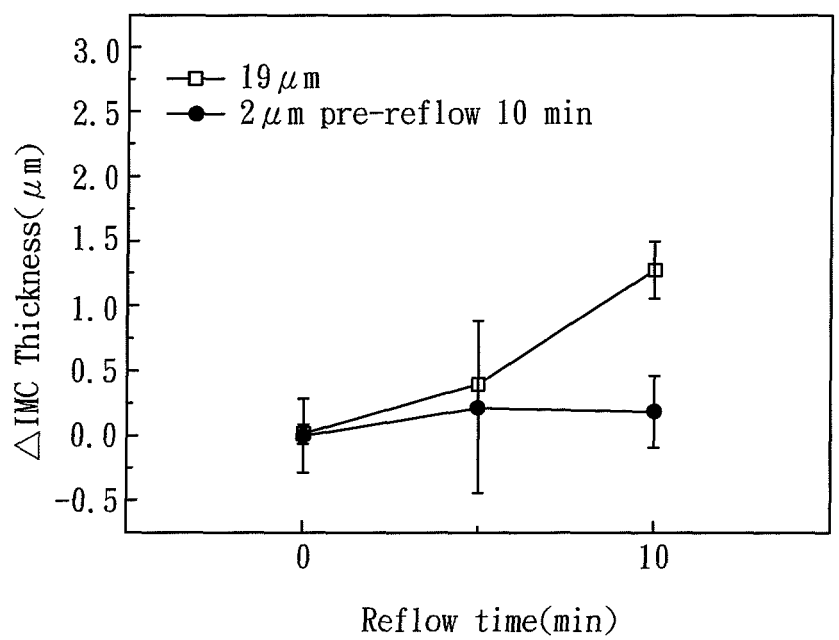
FIG. 8 is a change chart of the thickness of a Cu—Sn intermetallic compound as the reflowing time increases at 260° C.

Referring to FIG. 8, a change chart is shown indicating the thicknesses of Cu—Sn intermetallic compounds as the reflowing time increases. As shown in FIG. 8, the Cu—Sn intermetallic compound of the 2-μm-SnAg specimen, which is already performed the pre-reflowing process for 10 μmin, does not significantly increase the thickness of the Cu—Sn intermetallic compound as the second reflowing time increases, and only increases about 0.2 μm. However, the thickness of the Cu—Sn intermetallic compound of the 19-m-SnAg specimen increases 1.6 μm after a reflowing process for 10 μmin. Therefore, this proves the growth of the thickness of the Cu—Sn intermetallic compound can be inhibited via the thin solder layer being deposited on the metal pad prior to a bonding process, according to the method of the present invention. Meanwhile, the Cu pad is isolated from the solder bumps, so that the thickness reducing rate of the Cu pad is decreased apparently.

In addition, according to the method for inhibiting the growth of the intermetallic compounds of the present invention, the mechanism inhibiting the growth of the intermetallic compounds is caused by the following reasons:

(1) If the thin solder is not deposited on the metal pad prior to the bonding process, the Cu—Sn intermetallic compound (e.g. $Cu_6Sn_5$ compound) with similar semicircular structure will be formed. The shape of the Cu—Sn intermetallic compound in 19-μm-SnAg specimen after the reflowing process for 1 μmin is shown in FIG. 7A. The residue of the solder bump of the 19-μm-SnAg specimen is etched by etching solutions so as to observe the shape of the Cu—Sn intermetallic compounds. There are many channels in the $Cu_6Sn_5$ with semicircular structure, so that Cu atoms can permeate into the solder, and react with the solder through the channels.

Furthermore, the thin solder layer is deposited on the metal pad prior to the bonding process as the method of the present invention. After the pre-reflowing process for 10 μmin, the $Cu_6Sn_5$ or $Cu_3Sn$ compounds having similar laminated structure with few channels on 2-μm-SnAg specimen are formed. The solder is only 2 μm, and consumed completely after the reflowing process for 10 μmin, so that the channels in the Cu—Sn intermetallic compounds are closed. Therefore, when a solder having an appropriate thickness is further deposited on the 2-μm-SnAg specimen, the reaction of Cu atoms and the solder on the 2-μm-SnAg specimen can be inhibited efficiently.

(2) The thin solder layer has a very thin thickness (e.g. only 2 μm), and it is consumed completely after the reflowing process. $Cu_6Sn_5$ compounds can be totally or partially transformed to $Cu_3Sn$ compounds with laminated structure. The underlying Cu is not easy to permeate into the solder, so that the reaction of Cu atoms and the solder can be inhibited efficiently, and the growth of the thickness of the Cu—Sn intermetallic compound can be also inhibited.

The method of the present invention is proved to inhibit the growth of the intermetallic compounds according to the above embodiment. Once the growth of the intermetallic compounds can be inhibited, the growth of Sn whiskers can also be inhibited. Therefore, the present invention is used for inhibiting the growth of Sn whiskers.

Although the present invention has been explained in relation to its preferred embodiment, it is to be understood that many other possible modifications and variations can be made without departing from the spirit and scope of the invention as hereinafter claimed.

What is claimed is:

1. A method for inhibiting growth of intermetallic compounds, comprising the steps of:
    (i) preparing a substrate element, including:
        (i-1) depositing at least one layer of metal pad on a substrate;
        (i-2) depositing at least one thin solder layer onto the layer of metal pad, and then performing a heat treatment to obtain the substrate element; and depositing a bump of solder on the substrate element; and
    (ii) performing a following bonding process with the substrate element and other elements;
    wherein a thin intermetallic compound is formed by the reaction of the thin solder layer and the metal in the metal pad after the heat treatment of the thin solder layer prior to a flip-chip bonding process, and the thin solder layer is completely reacted into the thin intermetallic compound.

2. The method for inhibiting growth of intermetallic compounds according to claim 1, wherein the substrate is a semiconductor chip or a silicon chip.

3. The method for inhibiting growth of intermetallic compounds according to claim 1, wherein the metal in the metal pad is copper.

4. The method for inhibiting growth of intermetallic compounds according to claim 1, wherein the solder is lead free solder.

5. The method for inhibiting growth of intermetallic compounds according to claim 1, wherein the thickness of the thin solder layer is 4mm or less.

* * * * *